(12) United States Patent
Blomiley et al.

(10) Patent No.: US 10,411,017 B2
(45) Date of Patent: Sep. 10, 2019

(54) MULTI-COMPONENT CONDUCTIVE STRUCTURES FOR SEMICONDUCTOR DEVICES

(71) Applicant: Micron Technology, Inc., Boise, ID (US)

(72) Inventors: Eric Blomiley, Boise, ID (US); Fatma Arzum Simsek-Ege, Boise, ID (US)

(73) Assignee: Micron Technology, Inc., Boise, ID (US)

(*) Notice: Subject to any disclaimer, the term of this patent is extended or adjusted under 35 U.S.C. 154(b) by 18 days.

(21) Appl. No.: 15/692,779

(22) Filed: Aug. 31, 2017

(65) Prior Publication Data

US 2019/0067295 A1 Feb. 28, 2019

(51) Int. Cl.
| | | |
|---|---|---|
| H01L 21/28 | (2006.01) |
| C23C 16/06 | (2006.01) |
| H01L 27/108 | (2006.01) |
| H01L 29/49 | (2006.01) |
| C23C 16/455 | (2006.01) |
| H01L 21/768 | (2006.01) |
| H01L 21/285 | (2006.01) |

(52) U.S. Cl.
CPC ........ *H01L 27/10891* (2013.01); *C23C 16/06* (2013.01); *C23C 16/45527* (2013.01); *H01L 21/28079* (2013.01); *H01L 21/28088* (2013.01); *H01L 21/28556* (2013.01); *H01L 21/76846* (2013.01); *H01L 29/495* (2013.01); *H01L 29/4958* (2013.01); *H01L 29/4966* (2013.01)

(58) Field of Classification Search
CPC ......... H01L 27/10891; H01L 27/10885; H01L 27/10882; H01L 27/10888; H01L 29/4958; H01L 29/4236; H01L 29/495; H01L 21/28079; H01L 21/76846; H01L 21/28088; H01L 21/28556; H01L 21/76876; H01L 29/4966; C23C 16/06; C23C 16/45527
See application file for complete search history.

(56) References Cited

U.S. PATENT DOCUMENTS

| | | | | |
|---|---|---|---|---|
| 6,140,173 A * | 10/2000 | Wolters | ............. | H01L 27/11502 257/295 |
| 6,737,313 B1 * | 5/2004 | Marsh | ............... | H01L 21/28556 257/E21.018 |
| 7,105,401 B2 * | 9/2006 | Lee | ..................... | H01L 21/3141 257/E21.01 |
| 7,273,814 B2 * | 9/2007 | Matsuda | ................. | C23C 16/18 257/E21.018 |
| 8,025,922 B2 * | 9/2011 | Haukka | ............... | C23C 16/0218 427/248.1 |

(Continued)

*Primary Examiner* — Michael M Trinh
(74) *Attorney, Agent, or Firm* — Schwegman Lundberg & Woessner, P.A.

(57) ABSTRACT

Described are methods for forming multi-component conductive structures for semiconductor devices. The multi-component conductive structures can include a common metal, present in different percentages between the two components of the conductive structures. As described example, multiple components can include multiple ruthenium materials having different percentages of ruthenium. In some applications, at least a portion of one of the ruthenium material components will be sacrificial, and removed in subsequent processing.

5 Claims, 5 Drawing Sheets

(56) References Cited

U.S. PATENT DOCUMENTS

| | | |
|---|---|---|
| 9,385,132 B2 | 7/2016 | Heineck et al. |
| 2004/0224475 A1* | 11/2004 | Lee .................... C23C 16/0281 |
| | | 438/399 |
| 2007/0059502 A1* | 3/2007 | Wang .................... C23C 14/046 |
| | | 428/209 |
| 2008/0113483 A1 | 5/2008 | Wells |
| 2011/0220994 A1 | 9/2011 | Parekh et al. |
| 2015/0243748 A1* | 8/2015 | Pulugurtha ......... H01L 29/7827 |
| | | 257/330 |

* cited by examiner

MULTI-COMPONENT CONDUCTIVE STRUCTURES FOR SEMICONDUCTOR DEVICES

TECHNICAL FIELD

Embodiments described herein relate generally to methods and apparatus for providing conductive structures in semiconductor devices; and more particularly relate to methods and apparatus for forming such a conductive structures including at least two materials including different amounts of a selected metal; and as described, relate to two materials with differing ruthenium content.

BACKGROUND

Many forms of semiconductor die use various metal or metal-containing materials to form various conductive structures. Many such metals have been used, including, silver, gold, tungsten, aluminum, and various alloys thereof. In recent years, in various forms of memory devices and other semiconductor devices, tungsten (W) has been a suitable material for conductive structures, particularly longer conductors. Tungsten has been used for conductors in various forms of memory devices, including word lines in memory arrays, which typically extend across substantial portions of the array. However, as critical dimensions of features are reduced in successive evolutions of semiconductor devices, for example, as critical dimensions reach 5-20 nm and below, conventional materials, such as tungsten, exhibit a resistance which complicates device design and performance.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As noted above, reduction in size of the critical dimension of conductive structures in semiconductor devices, such as memory devices (as just one example), would benefit from new materials and method of forming such features. One potentially useful material is ruthenium (Ru) which has approximately one-half the resistance of tungsten at smaller dimensions (for purposes of the present description, a critical dimension of 20 nm or less). Such ruthenium may be formed, for example through chemical vapor deposition (CVD) technique, and in some examples the CVD technique may include a plasma chemical vapor deposition (PCVD) technique, or a plasma-enhanced CVD (PECVD) technique.

One problem encountered with conventional ruthenium deposition techniques is that the processes can take more time than would be desirable, particularly when forming the ruthenium to fill relatively high aspect recesses (for example, an aspect ratio of 6:1 or greater). Additionally, when trying to fill such high aspect recesses with a critical dimension of 20 nm or less, localized stresses in the deposited ruthenium can often lead to deformation in the structures defining the upper portions of the recesses. This deformation is particularly problematic when the conductive structures extend over a substantial dimension of the semiconductor die, as in the case of word lines extending across a memory array.

The present disclosure describes various embodiments for forming the ruthenium conductive structures from two ruthenium-containing materials containing different amounts of ruthenium. A first of the materials will have a relatively high percentage of ruthenium for example 60 to 70% or more; and the second of the materials will have a lower percentage of ruthenium, for example 30 to 40% or less. In some examples, at least one of the ruthenium-containing layers will be formed through a cyclic deposition process, such as, for example, a CVD or PVCD cyclic deposition process, as discussed in more detail below. In many beneficial examples, at least the ruthenium-rich material will be deposited by a cyclic deposition process; and in many examples will be deposited first. A second ruthenium material having a different composition is then deposited on the first ruthenium material. In some applications, a substantial portion of the second ruthenium material may be sacrificial, and thus removed during subsequent processing of the substrate. Various examples of these embodiments are described below.

Figure 1A:
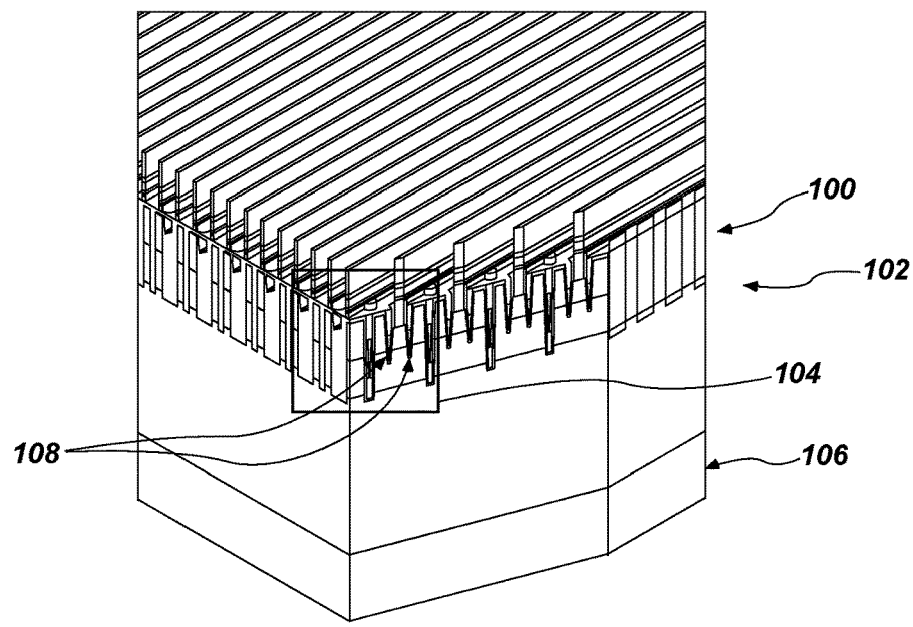
FIGS. 1A-B depict, in FIG. 1A, a cross section of an example portion of a memory device, depicting a memory array having recessed access devices; and in FIG. 1B an enlarged view of the cross-section of FIG. 1A as indicated by the box in that figure.
Figure 1B:
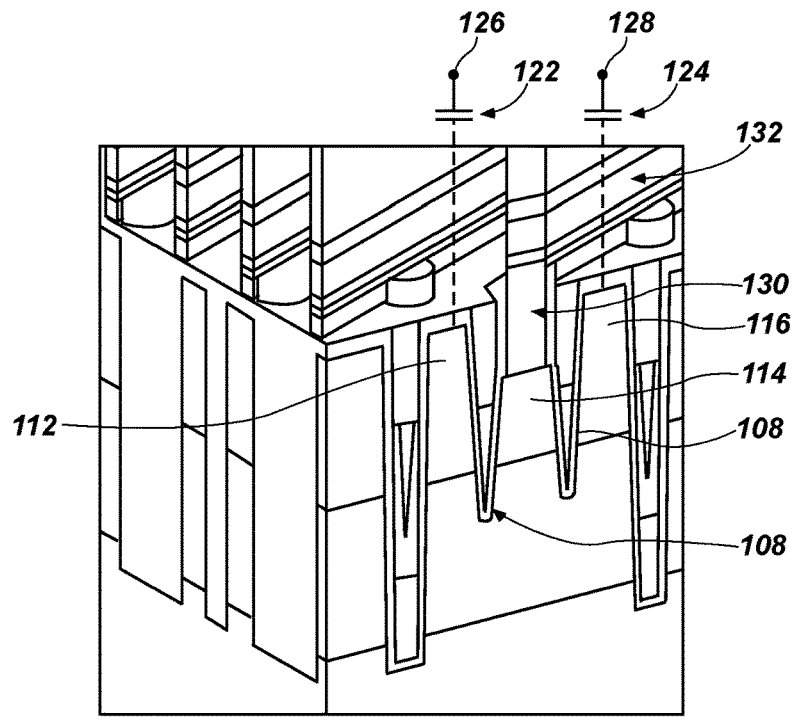

Referring now to FIGS. 1A-B, the figures depict cross-sections of a representative portion of a memory array 100 as may be formed on a semiconductor die, indicated generally at 102. As a result, the depicted portion of a memory array 100 represents a fragment of the semiconductor die 102. The identified box 104 in FIG. 1 identifies the portion of the semiconductor die 102 depicted in FIG. 1B. For purposes of the present description, the memory array will be described in the example of a dynamic random-access memory (DRAM) device, with the semiconductor die 102 containing the memory array of the DRAM. However, as will be apparent to persons skilled in the art having the benefit of this disclosure, the described techniques may be used in a variety of semiconductor devices, and for any of a variety of conductive structures therein, beyond DRAM and the example structures provided herein.

Semiconductor die 102 includes a semiconductor substrate, indicated generally at 106, comprising one or more materials, which may be of any desired construction known to persons skilled in the art, including bulk monocrystalline silicon, silicon on insulator (SOI), germanium (Ge), Silicon-germanium (SiGe), a III-V alloy, and combinations thereof, and analogous materials known to persons skilled in the art; all of which fall within the term "semiconductor substrate" as used herein. The semiconductor substrate may be doped at one or more levels and/or regions with dopants to establish a desired polarity within such levels and/or regions.

The depicted portion of the memory array 100 includes recessed access devices (RADs), indicated generally at 108, of respective field effect transistors (FETs), in which the gate is formed in a recess 118, 120 in a semiconductor material (for example, bulk silicon of the semiconductor substrate)

defining pillars 112, 114, 116, and in which the source and drain regions of the FETs, formed in respective pillars 112, 114, 116, are above level of the gates. The substrate will be doped to function as the channel region of each RAD. In the example DRAM array, source/drain regions in pillars 112, 116 will extend to charge storage devices, here in the form of capacitors 122, 124 extending to circuit nodes 126, 128, respectively. The source/drain region of pillar 114 will extend through a contact structure, indicated generally at 130, to a bit line stack, indicated generally at 132.

Beyond the example DRAM as described herein, RADs may be used in many other types of memory devices, including, for example various forms of magneto-resistive random-access memory (MRAM), phase change random-access memory (PCRAM), etc. RADs formed in accordance with the examples herein may also be used in types of non-memory memory devices.

The gates of multiple FETs may be formed as part of a word line extending across the memory array 100 (or some portion thereof). In the present example, the RADs will be "saddle RAD" devices, wherein the word line periodically along its length extends downwardly to either side of the channel extending around the gate of a respective source/drain region to provide greater width to the channel, and forming a saddle shape to the channel of each RAD. The general structure and formation of saddle RAD devices is known to persons skilled in the art, and will therefore not be addressed further herein.

As noted above, in the described example, the word lines will be formed by depositing multiple ruthenium materials having different percentages of ruthenium. In the present example, additional conductive structures, including isolation trenches, will be filled with multiple layers with multiple ruthenium materials with different percentages of ruthenium in the same manner (and in the example process, through deposition of the same ruthenium-containing layers). As will be described in more detail relative to FIGS. 2A-E, after the multiple ruthenium materials are deposited, some portion of the ruthenium materials will be etched back, to a level beneath the source/drain regions leaving a recess between adjacent source/drain regions, and in the present example, also in the isolation trenches. In many examples, these recesses within the trenches will then be filled with a dielectric structure.

After the dielectric structure is formed over the word lines and isolation structures of the DRAM array, bit line contact structures 130 will be formed, followed by bit line stacks 132, which in many examples will include multiple layers, as known to persons skilled in the art. In many examples, the bit line contact structures 130 extend to a common source/drain region of two FETs in pillar 116. In an example such as that depicted, once the bitline stacks 132 have been formed, then capacitors 122, 124 may be formed in electrical communication with each of the other source/drain regions of each FET in the array (such as in pillars 112, 116). In many examples, these capacitors will extend between, and/or above, the bit line stacks 132. In devices other than DRAM, other charge storage structures, or other physical property storage structures, may be placed between and/or above the bit line stacks 132 and in communication with the identified source/drain regions 112, 116.

Figure 2A:
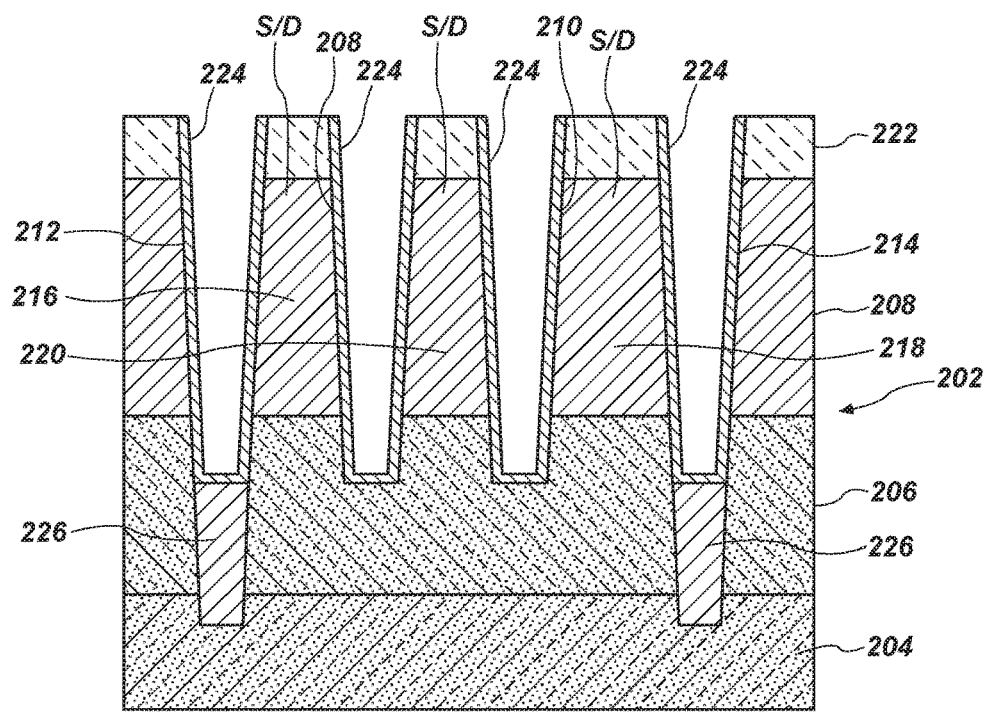
FIGS. 2A-E depict a representative fragment of a substrate at simplified representative stages in forming conductive structures.

Referring now to FIGS. 2A-E, those figures depict a representative fragment 200 of a substrate structure, indicated generally at 202, at simplified representative stages in forming conductive structures of substrate structure 202. As used herein, the term "substrate structure" refers to a semiconductor substrate (as discussed above) having one or more features formed therein or additional materials formed thereon, as occurs in the manufacture of semiconductor devices. In this case, DRAM word lines, gates, and isolation structures. In FIG. 2A, the substrate structure 202 includes multiple doped regions 204, 206. In the depicted example, a dielectric 222, for example an oxide, is formed over the substrate. Word line recesses 208, 210 have been formed, as well as isolation recesses 212, 214, which together with recesses beyond the plane of the figure, define pillars 216, 218 and 220. Pillars 216, 218, and 220 will each define a respective source/drain of two FETs, in which the source/drain of pillar 218 is shared between the two FETs. In the depicted example, isolation recesses 212, 214 extend to a greater depth than that of word line recesses 208, 210, but have been partially filled with a dielectric 226, such as oxide, which may extend up to a level approximately equal to that of the depth of word line recesses 208, 210, as depicted. An oxide layer 224 is formed within word line recesses 208, 210, and isolation recesses 212, 214. A portion of oxide layer 224 within word line recesses 208, 210 will serve as a gate dielectric for the two FETs.

In some examples, 216, 218 and 220 may be doped similarly, with a dopant of the same polarity, resulting in no PN junctions between each of pillars 216, 220 and pillar 218. For example in some embodiments, each of pillars 216, 218, 220 may include N-type materials. In alternative examples, each of pillars 216, 218, 220 may include P-type materials.

In other examples, each of pillars 216, 218 may be doped similarly (For example with an N+ material), while intermediate pillar 220 may be N-doped. Alternatively, the pillars might alternatively be doped with P+ and P-material, in an analogous manner.

Figure 2B:
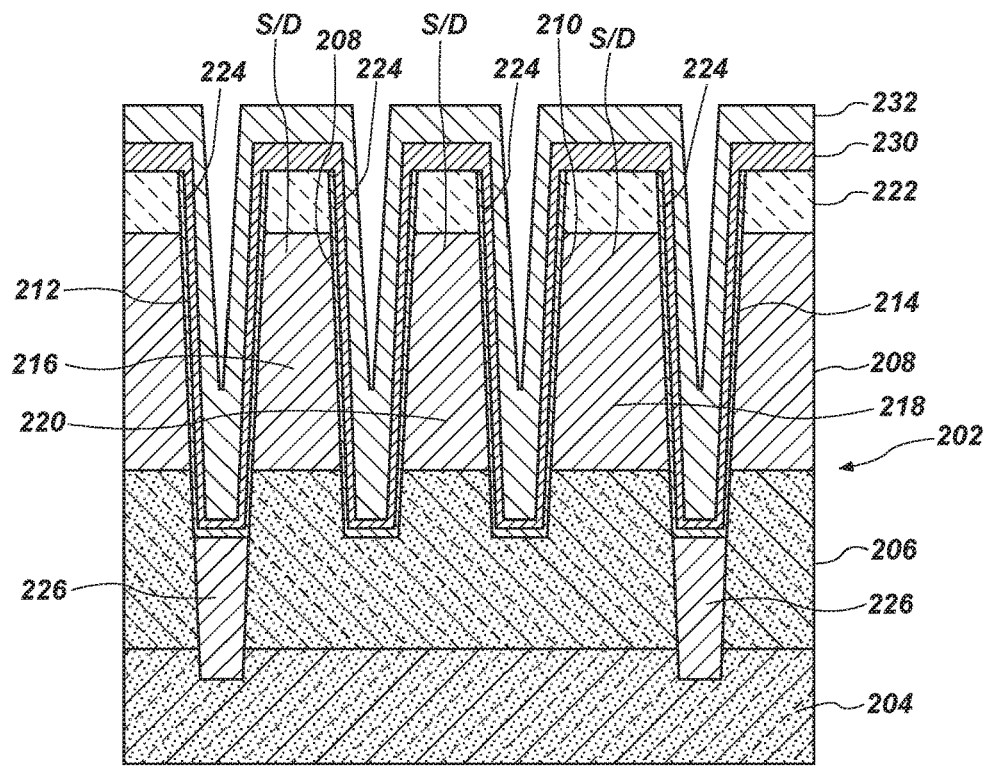

Referring now to FIG. 2B, the figure shows the substrate structure 202 of FIG. 2A after deposition of a barrier layer 230, and a first ruthenium-containing material 232. Barrier layer 230 will be selected to protect the gate dielectric of oxide layer 224 during subsequent processing. In some examples, barrier layer 230 will include titanium nitride (TIN), which may be formed by conventional processes.

In some examples, the first ruthenium-containing material 232 will be deposited by CVD cyclic deposition, in some examples, to a depth of approximately 50-100 Å. The term "cyclic deposition" as used in this description refers to the sequential introduction of two or more reactive gasses to deposit a limited depth, in some cases potentially as limited a single atomic layer (for example, atomic layer deposition, or "ALD"), of material on a surface. As noted below, the actual incremental depth of material deposited per cycle may be selected for any specific application, as will be apparent to persons skilled in the art having the benefit of this disclosure. In many examples, the two or more reactive gases are sequentially introduced into a processing chamber at selected intervals to deposit the desired material, with successive intervals separated by a delay, to facilitate forming of sequential layers on one another. In some examples, during the delay another precursor may be introduced, as described below.

This first ruthenium-containing material 232 can be deposited using a variety of ruthenium-containing precursors. One suitable such precursor is tricarbonyl [(1,2,3,4-eta)-1,3-Cyclohexadiene] ruthenium, otherwise known in the industry as CHDR. Other alternative precursors that might be used are: Bis(cyclopentadienyl)ruthenium [$C_{10}H_{10}Ru$]; Bis(pentamethylcyclopentadienyl)ruthenium [$Ru(C_5(CH_3)_5)_2$]; or Bis(ethylcyclopentadienyl)ruthenium [$C_7H_9RuC_7H_9$]. In some examples, for example where chemistry other than CHDR is utilized for the Ru deposition phase, the deposition phase may include multiple precursors introduced sequentially, followed by a delay.

In an example process utilizing CHDR, oxygen (O2) may be introduced during the delay. The introduction of O2 serves to remove carbon (which is a contaminant resulting from decomposition of the CHDR precursor), from the deposited material. The described two-phase deposition process (Ru deposition phase and interval phase) offers the advantage of being able to be implemented, such as in the example described above, to facilitate utilizing precursors and deposition techniques that otherwise could result in undesirable levels of residual carbon in the film. As described above, the incremental deposition (and in some examples oxidation during the interval phase) facilitates mitigation of the otherwise residual carbon that could otherwise adversely impact of the electrical characteristics of the deposited material.

In the present example of forming word lines and gates, the first ruthenium-containing material 232 will be deposited to a thickness to form the majority of the word lines and associated gates. Thus, the objective of the material deposition is to provide a ruthenium-rich material of relatively low resistance. For the example application, a ruthenium content in the deposited material of greater than 60%, and for many applications desirably at least 70%, may be used for the first ruthenium-containing material 232; with a target resistance of 50-70 ohms per cell, or less, along the word line. Processing time required for the cyclic deposition, as determined by both the number of cycles and the duration of each, as well as the duration of an oxidation during the "delay" portion of each cycle, will be determined by persons skilled in the art having the benefit of this disclosure in accordance with the requirements of the specific application.

Advantageous benefits have been identified using CHDR precursor utilizing 30-50 deposition cycles, with a deposition time of between approximately 10 and 17 seconds, with a delay (oxidation) time of 5 to 20 seconds, at a temperature of 230° C.: as set forth in the table below.

| Run | Temp (° C.) | # of Cycles | Dep Time (sec.) | Oxidation Time |
|---|---|---|---|---|
| 1 | 230 | 50 | 10 | 10 |
| 2 | 230 | 30 | 16.7 | 10 |
| 3 | 230 | 30 | 16.7 | 20 |
| 4 | 230 | 50 | 10 | 5 |
| 5 | 230 | 50 | 10 | 20 |

Run 4 yielded the most ruthenium-rich film, while run 3 yielded the least ruthenium-rich film. Utilizing another ruthenium-containing precursor and/or a different processing temperature may result in either fewer or more deposition cycles being required. For example, for some applications, 10 deposition cycles may be sufficient, while for other applications 80, or more, deposition cycles may be advantageous.

Figure 2C:
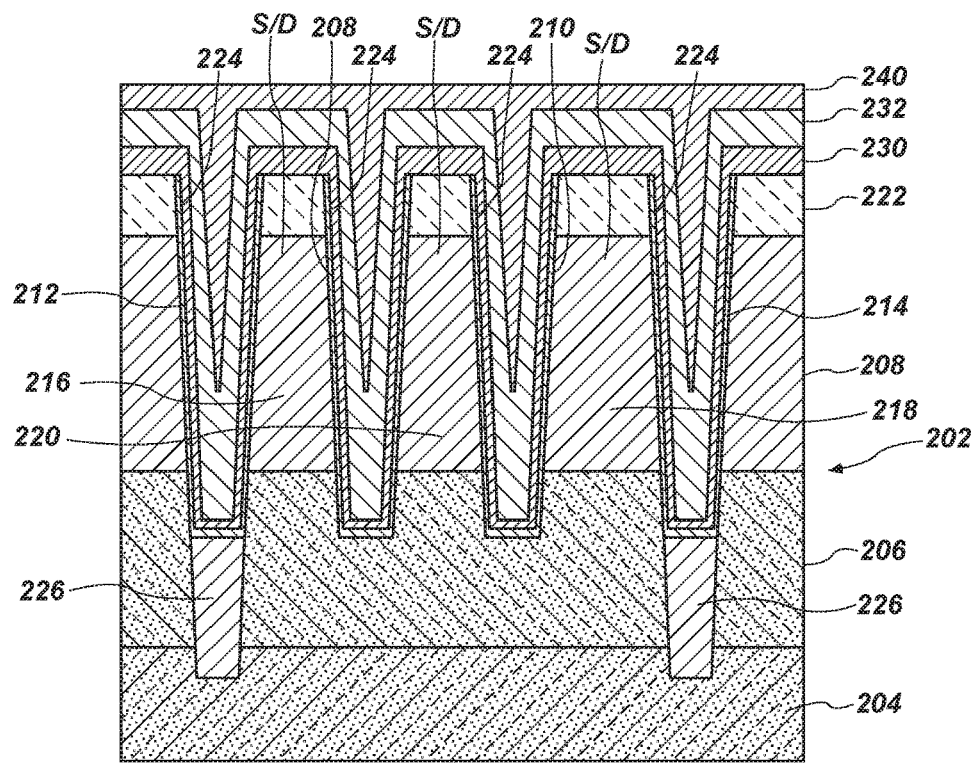

Referring now to FIG. 2C, after deposition of the first ruthenium-containing material 232, additional ruthenium will be added in the form of a second ruthenium-containing material 240 deposited on the first ruthenium-containing material 232. In many examples, the second ruthenium-containing material 240 will be formed with a lower percentage of ruthenium in the film (for example, up to 40% ruthenium; with 30% or less ruthenium being desirable for many applications); and will be deposited in a manner which may occur relatively quickly relative to the deposition of the first ruthenium-containing material 232. In some examples, the second ruthenium-containing material 240 may be formed by introducing a "contaminant" into the ruthenium precursor used for the first ruthenium-containing material 232, such contaminant may be any one or more of carbon, nitrogen, oxygen, silicon oxide and polysilicon. For example, a carbon "contaminant" may be introduced by introducing either $CH_4$ or $C_2H_6$ into the (for example) CVD or PCVD chamber along with the ruthenium precursor, such as the example gas noted above. In examples in which the "contaminant" is Nitrogen (N), $NH_3$ may be used in combination with the ruthenium precursor. In some examples, the "contaminant" may be, or at least include, residual precursor species from the prior deposition, which remain in the chamber as a result of incomplete reactions. As noted above, in the example in which CHDR is utilized as the ruthenium precursor, some residual carbon will be present in the deposited film (except as mitigated during the deposition phase, as discussed above). The ability to accommodate a higher carbon content in the second ruthenium-containing material (with the resulting impact on electrical properties in that material) facilitates a potentially simpler and quicker deposition process for the second ruthenium-containing material In some examples, the second ruthenium-containing material 240 may be deposited through a relatively limited number of cycles, such as from 1 to 20 cycles, with a deposition time between 400 and 600 seconds (depending upon the volume of material needed), with an interval (in some cases, oxidation) time of 40 to 75 seconds used when multiple deposition cycles are used. In some examples, the second ruthenium-containing material 240 can be deposited in a single cycle, for example, with a deposition time of approximately 500 seconds (the actual time required for any specific application being a function of the selected precursors, processing conditions, and desired deposition thickness, as discussed above).

The lower ruthenium content in the second ruthenium-containing material 240 will result in a higher resistivity for the material. However, in the example application, wherein deposition of the first and second ruthenium-containing materials 232, 240 are used to form word lines and isolating structures, a substantial portion of the second ruthenium-containing material 240 will be sacrificial. One benefit of using the second ruthenium-containing material even though it may be substantially sacrificial, is compatibility with the underlying ruthenium-rich layer. Additionally, the second ruthenium-containing material can preferably be deposited more quickly than the underlying first ruthenium-rich layer.

Figure 2D:
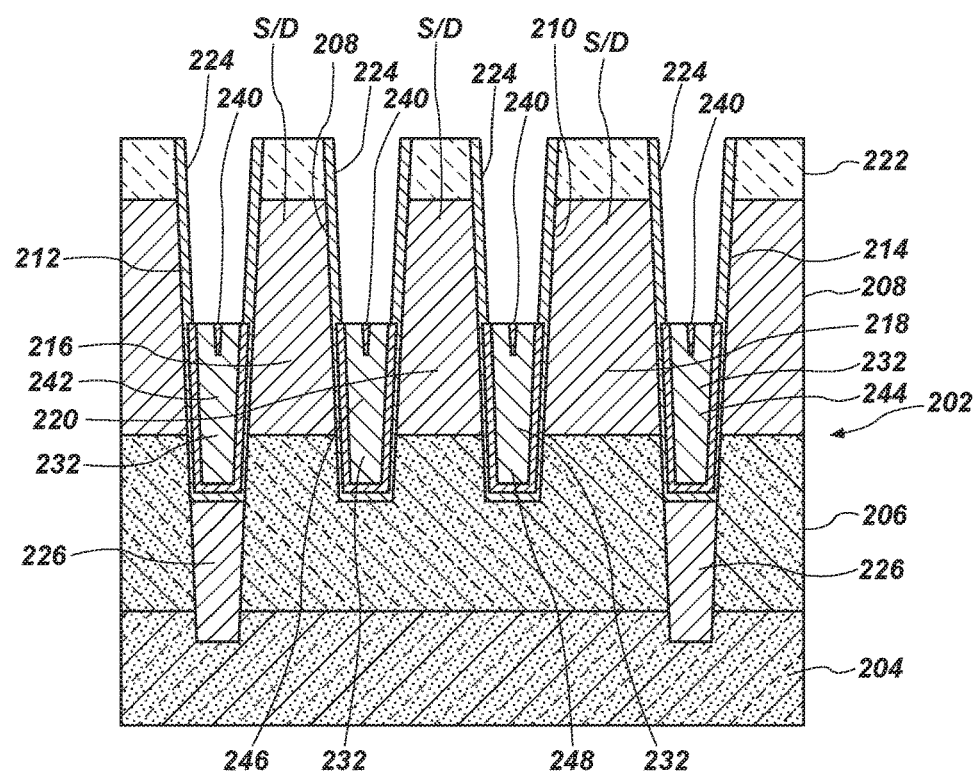

In one example construction, for example, the ruthenium-containing materials may be etched as needed to form the word lines and associated gates extending to the desired level. An example construction is depicted in FIG. 2D in which the first and second ruthenium-containing materials 232, 240 and the barrier layer 230 are etched back to a selected depth to define the word lines and gates 246, 248 (and also to define the isolation structures 242, 244 in recesses 212, 214). In one example construction, the ruthenium-containing materials and the barrier layer are etched to approximately 60-70 nm below the surface of the exposed oxide cap at the top of each pillar. Other factors in determining the degree of recess of the ruthenium-containing materials includes the doping levels of the pillars, and the physical location of the implants, as well as the desired length of the gate region of each FET.

As can be seen in FIG. 2D, a small amount of the second ruthenium-containing material 240 can remain without significantly impacting the electrical characteristics of the remainder of the word lines 246, 248 and isolation structures 242, 244. As will be apparent to persons skilled in the art, etching of the layers to result in the structure of FIG. 2D may require multiple etch processes. The ruthenium-containing films may be etched by a selected wet etch process; while the underlying barrier layer will, in many examples may be etched by a different process. For examples in which the barrier layer includes titanium nitride, a dry etch process, such as plasma etching, may be utilized, for example, utilizing CH4 as the etching agent. In some examples, the etch may be a cyclic etch process.

Figure 2E:
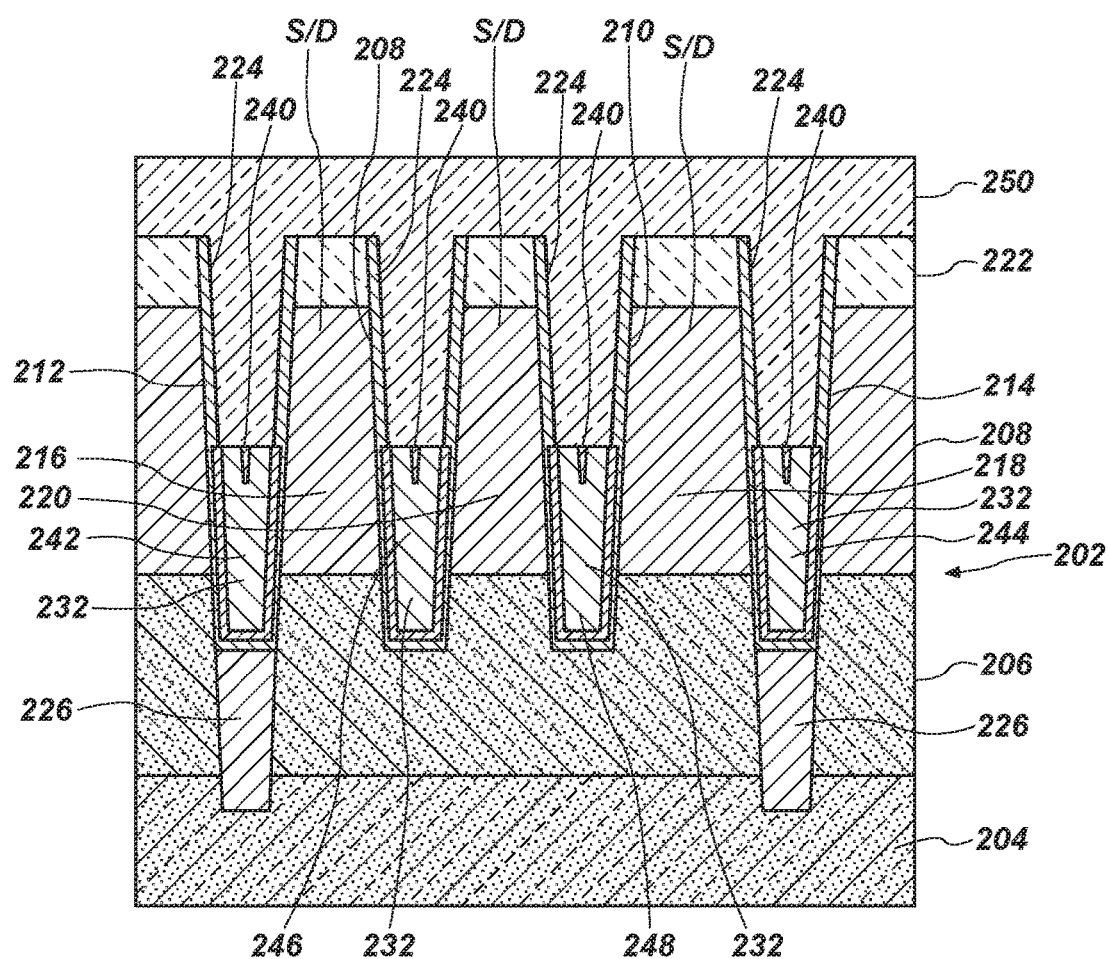

Referring now to FIG. 2E, in many applications, such as that depicted in FIGS. 1A-B, where bit lines and charge storage devices will be formed above the array of RAD access devices, a dielectric structure 250 will be formed, filling the open portions 252, 254 of the word line recesses, and the open portions of the isolation recesses 256, 258. After the structure generally is depicted in FIG. 2E is completed, other structures, including contact structures (130 in FIGS. 1A-B), bit line stacks (132 in FIG. 1A-B), and charge storage devices (capacitors 122, 124 in FIGS. 1A-B) may be formed above substrate structure 202.

Figure 3:
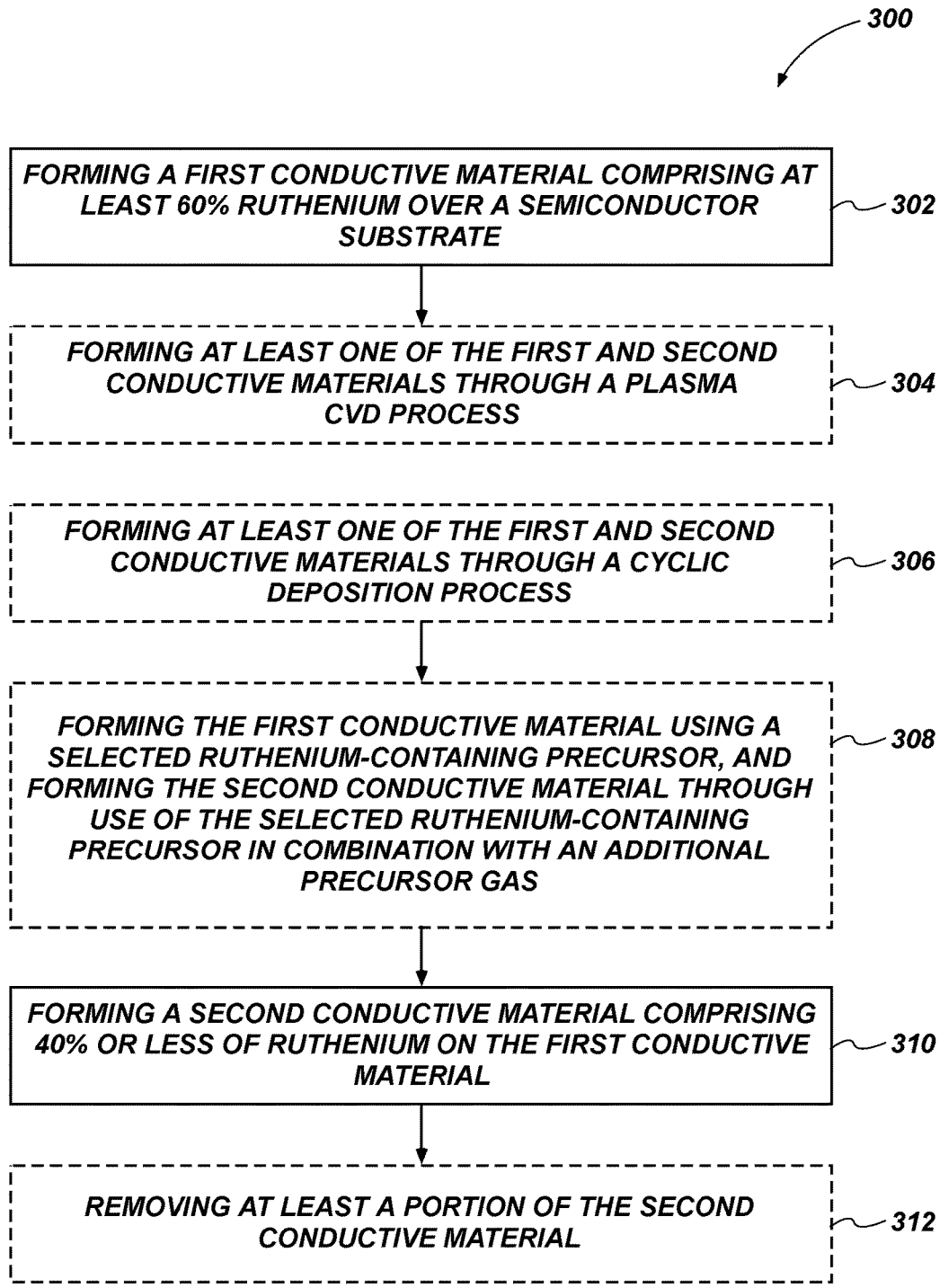
FIG. 3 depicts an example process for forming multi-component conductive structures in accordance with the present description.

Referring now to FIG. 3, the figure depicts an example process, indicated generally at 300, for forming multi-component conductive structures in accordance with the present description. As indicated at 302, a first conductive material comprising at least 60% ruthenium is formed over a semiconductor substrate. As noted previously, in many examples the ruthenium content will be 70% or greater. As described above, in some examples the first conductive material may be formed in recesses in the substrate, for example to form RADs. In other examples, the first conductive material may be formed in a recess at least partially within a dielectric layer, such as a damascene process.

Subsequently, as indicated at 310, a second conductive material comprising 40% or less of ruthenium is formed on the first conductive material.

Operations indicated at 304-308 are optional implementations of operations 302 and/or 310. As indicated at 304, at least one of the first and second conductive materials may be formed through a CVD process, in some examples, a PCVD or PECVD process. As indicated at 306, at least one of the first and second conductive materials may be formed through a cyclic deposition process, as discussed above. As indicated at 308, the first conductive material may be formed using a selected ruthenium-containing precursor, and the second conductive material may be formed through use of the same selected ruthenium-containing precursor in combination with an additional precursor gas, also as described above. As will be apparent from the preceding discussion, any one or more of optional operations 304-308 may be implemented, alone or in combination.

As indicated in 312, an additional optional operation is to remove at least a portion of the second conductive material. Optional operation 312 is useful, as in the above-described example, where one function of the second ruthenium-containing layer is to facilitate forming a recess structure, while reducing the time required for ruthenium deposition and/or minimizing deformation of structures surrounding and defining, at least in part, the space the ruthenium materials fill as a result of the ruthenium material deposition.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this description, prepositions such as "on," "over," and "under" are defined with respect to the conventional plane or surface being on the top or exposed surface of the substrate, regardless of the orientation of the substrate; and while "on" is intended to identify a direct contact of one structure with another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method of forming a semiconductor device, comprising:
   depositing a first conductive material over a substrate structure by a cyclic deposition process, the deposited first conductive material comprising at least 60% ruthenium;
   depositing a second conductive material on the first conductive material through a different deposition process than the cyclic deposition process, the deposited second conductive material comprising 40% or less of ruthenium;
   wherein the substrate structure comprises:
      a recess formed in the substrate structure, the recess at least partially defining at least two pillars; and
      wherein the first and second conductive materials extend into the recess between the two pillars;
   wherein the second conductive material comprises at least one of carbon, nitrogen, oxygen, silicon oxide, and polysilicon;
   wherein the first and second conductive materials are formed using a first ruthenium-containing precursor; and wherein the second conductive material is formed through introduction of an additional precursor gas with a second ruthenium precursor; and
   wherein the additional precursor gas comprises $CH_4$ or $C_2H_6$.

2. The method of claim 1, wherein the second conductive material comprises carbon.

3. The method of claim 1, wherein the first ruthenium-containing precursor and the second ruthenium-containing precursor are the same.

4. The method of claim 1 wherein the first ruthenium-containing precursor includes CHDR.

5. The method of claim 1, wherein the second conductive material is deposited on the first conductive material through a CVD process, and wherein the CVD-deposited second conductive material comprises 40% or less of ruthenium.

* * * * *